(12) United States Patent
Mizutani et al.

(10) Patent No.: US 7,232,957 B2  
(45) Date of Patent: Jun. 19, 2007

(54) HYBRID INTEGRATED CIRCUIT DEVICE AND METHOD OF MANUFACTURING THE SAME

(75) Inventors: Masahiko Mizutani, Ota (JP); Mitsuru Noguchi, Nitta-gun (JP); Nobuhisa Takakusaki, Ota (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/941,076

(22) Filed: Sep. 15, 2004

(65) Prior Publication Data

US 2005/0067186 A1    Mar. 31, 2005

(30) Foreign Application Priority Data

Sep. 25, 2003 (JP) .............................. 2003-333888

(51) Int. Cl.  
*H05K 1/16* (2006.01)
(52) U.S. Cl. ....................... 174/260; 174/254; 174/261
(58) Field of Classification Search ................ 174/260, 174/261  
See application file for complete search history.

(56) References Cited

U.S. PATENT DOCUMENTS 5,773,764 A * 6/1998 von Vajna ................... 174/250  
5,831,218 A * 11/1998 Hu et al. ..................... 174/250  
6,239,380 B1* 5/2001 Drussel et al. ............... 174/250  
6,379,792 B1* 4/2002 Isshiki et al. ............ 428/355 R  
6,638,592 B1* 10/2003 Schulz-Harder ............. 428/43  
6,844,504 B2* 1/2005 Wang et al. ................. 174/255  
2001/0023113 A1* 9/2001 Akram et al.

FOREIGN PATENT DOCUMENTS

JP          6-177295       6/1994  
JP          06-177295    * 6/1994

* cited by examiner

*Primary Examiner*—Dean A. Reichard  
*Assistant Examiner*—Yuriy Semenenko  
(74) *Attorney, Agent, or Firm*—Stephen B. Parker; Watchstone P+D, plc

(57) ABSTRACT

An object of the present invention is to provide a method of manufacturing a hybrid integrated circuit device, in which multiple circuit boards are manufactured from one large metal board by dicing. The hybrid integrated circuit device of the present invention includes a circuit board with a surface provided with an insulating layer, and conductive patterns provided on the insulating layer. Circuit elements are electrically connected to the conductive patterns. Further, each side surface of the circuit board includes a first inclined portion extending obliquely downward from a peripheral portion of the surface of the circuit board, and a second inclined portion extending obliquely upward from a back surface of the circuit board and formed to be larger than the first inclined portion.

10 Claims, 14 Drawing Sheets

HYBRID INTEGRATED CIRCUIT DEVICE AND METHOD OF MANUFACTURING THE SAME

BACKGROUND OF THE INVENTION

Priority is claimed to Japanese Patent Application Number JP2003-333888 filed on Sep. 25, 2003, the disclosure of which is incorporated herein by reference in its entirety.

1. Field of the Invention

The present invention relates to a hybrid integrated circuit device and a method of manufacturing the same. The present invention particularly relates to a hybrid integrated circuit device obtained by manufacturing multiple circuit boards from one large metal board, and a method of manufacturing the hybrid integrated circuit device.

2. Description of the Related Art

A description will be given of a constitution of a conventional hybrid integrated circuit device with reference to FIGS. 11A and 11B. FIG. 11A is a perspective view of a hybrid integrated circuit device 6, and FIG. 11B is a sectional view taken along the line X–X' in FIG. 11A.

Referring to FIGS. 11A and 11B, the conventional hybrid integrated circuit device 6 has a constitution as follows. The hybrid integrated circuit device 6 includes: a rectangular board 60; conductive patterns 62 formed on an insulating layer 61 provided on the surface of the board 60; circuit elements 63 bonded to the conductive patterns 62; fine metal wires 65 electrically connecting the circuit elements 63 to the conductive patterns 62; and leads 64 electrically connected to the conductive patterns 62. A hybrid integrated circuit formed on the surface of the circuit board 60 is sealed with insulation resin, a case material, or the like, whereby the hybrid integrated circuit device 6 is completed as a product.

Next, a description will be given of a method of manufacturing the hybrid integrated circuit device 6 with reference to FIGS. 12A to 14.

A description will be given of a process of splitting a large metal board 66A into strips with reference to FIGS. 12A and 12B. Of these drawings, FIG. 12A is a plan view of the large metal board 66A, and FIG. 12B is a sectional view of the large metal board 66A.

Referring to FIG. 12A, a method of splitting the large metal board 66A into strips will be described. Here, the large metal board 66A is split into the strips along dicing lines 4D. This splitting is performed by shearing using shearing force. Out of consideration for workability in a later bonding process or the like, a split-off metal board (strip) may be further divided into two or more pieces. Here, each split-off metal board (strip) is divided into two metal boards 66B with different lengths.

Referring to FIG. 12B, a constitution of the metal board 66A will be described. Here, the board 66A is a board made of aluminum, and both faces thereof have been anodized. Moreover, the surface where hybrid integrated circuits will be formed is provided with the insulating layer 61 in order to insulate the metal board 66A from conductive patterns. Furthermore, copper foil 68, which becomes the conductive patterns 62, is pressed onto the insulating layer 61.

A description will be given of a process of forming hybrid integrated circuits 67 on the surface of the metal board 66B, which is a split-off narrow board, with reference to FIGS. 13A and 13B. Of these drawings, FIG. 13A is a plan view of the narrow metal board 66B on which a plurality of the hybrid integrated circuits 67 are formed, and FIG. 13B is a sectional view of FIG. 13A.

First, the conductive patterns 62 are formed by etching the copper foil 68 pressed onto the insulating layer 61. Here, the copper foil 68 is etched into the conductive patterns 62 so that a plurality of the hybrid integrated circuits are formed on the narrow metal board 66B. Moreover, in some cases, a resin overcoating is applied onto the conductive patterns 62 for the purpose of protecting the conductive patterns 62.

Next, the circuit elements 63 are bonded onto the conductive patterns 62 at respective predetermined positions using a brazing material such as soft solder. For the circuit elements 63, passive elements and active elements can be employed in general. In addition, when power elements are mounted, the elements are mounted on heat sinks bonded onto the conductive patterns.

A description will be given of a method of splitting the metal board 66B with the plurality of hybrid integrated circuits 67 formed thereon into the individual circuit boards 60, with reference to FIG. 14. Each of the circuit boards 60, on the surfaces of which the hybrid integrated circuits 67 are respectively formed, is split off from the metal board 66B by punching out the portion of the circuit board 60 using a press. Here, the press punches the metal board 66B out from the side where the hybrid integrated circuits 67 are formed. Therefore, margins, where the conductive patterns 62 and the circuit elements 63 are not formed, are provided in the peripheral end portions of the circuit boards 60.

The circuit boards 60, individually separated in the above-described process, are completed as products after subjected to a process of sealing the hybrid integrated circuits 67 and the like.

However, the above-described hybrid integrated circuit device and method of manufacturing the same have had problems as described below.

Since the circuit boards 60 are separated from the metal board 66B by pressing the metal board 66B, portions at least within 2 mm from the peripheral end portions of the circuit boards 60 serve as margins. Accordingly, the peripheral portions of the circuit boards 60 are dead spaces, and therefore, there has been a problem that an entire device becomes large even if the degree of integration of the hybrid integrated circuit 67 is increased.

For a similar reason to the foregoing, some circuit elements 63 such as heat sinks cannot be placed in the peripheral portions of the circuit boards. This fact becomes a constraint when the conductive patterns 62 are designed, and therefore, there has been a problem that the density of the hybrid integrated circuit cannot be increased.

Moreover, since the side surface portions of the board are vertically formed, there has been a problem that when the board is sealed with resin, the adhesion between the board and the sealing resin is poor.

When the circuit board 60 is separated from the metal board 66B by "punching" using a press, there has been a problem that cracks occur in the insulating layer 61, formed on the surface of the circuit board 60, due to an impact of the "punching."

In the case in particular where multi-layer interconnections are formed on the surface of the circuit board 60, the insulating layers become thick depending on the number of layers to be stacked. Accordingly, when multi-layer interconnections are formed, the problem of the occurrence of cracks in the insulating layers 61 has arisen more noticeably.

The insulating layer 61 is formed on the surface of the metal board 66B. The insulating layer 61 is very hard because it is highly filled with alumina. Accordingly, there has been a problem that a blade of a press for performing "punching" is worn out soon. Moreover, the replacement of a blade of a press is work requiring skilled labor, and what is more, takes a very long time. Therefore, there has been a problem that the productivity is reduced. In addition, this blade used for punching is very expensive. Therefore, further, the fact that the life of this blade is very short may cause an increase in the cost of an entire device.

When the circuit board 60 is separated from the metal board 66B by "punching" using a press, the peripheral portions of the metal board 66B become a loss of material. Accordingly, there has been a problem that the loss from disposal of the metal board 66B, which is a material, becomes large.

SUMMARY OF THE INVENTION

The present invention has been achieved in the light of the above-mentioned problems. A primary object of the present invention is to provide a hybrid integrated circuit device in which the effective area of a board surface is increased. Moreover, another primary object of the present invention is to provide a method of manufacturing the hybrid integrated circuit device, in which multiple circuit boards are manufactured from one large metal board by dicing.

A hybrid integrated circuit device of the present invention includes: a circuit board; a conductive pattern provided on a surface of the circuit board; and a circuit element electrically connected to the conductive pattern, wherein a side surface of the circuit board includes a first inclined portion which extends obliquely downward from a peripheral portion of the surface of the circuit board, and a second inclined portion which extends obliquely upward from a back surface of the circuit board and is formed to be larger than the first inclined portion.

A method of manufacturing a hybrid integrated circuit device of the present invention includes the steps of: preparing a board having a surface which has been subjected to insulation treatment; forming conductive patterns on the surface of the board; forming first grooves in a grid pattern on the surface of the board, and second grooves in a grid pattern on a back surface of the board, the second grooves being larger than the first grooves; electrically connecting circuit elements to the conductive patterns; and separating the board along portions where the first and second grooves are formed.

In the hybrid integrated circuit device according to this aspect, the second inclined portions are formed to be larger than the first inclined portions, the first and second inclined portions being provided on the side surfaces of the circuit board. This means, in other words, the first inclined portions are smaller than the second inclined portions. Accordingly, by making the first inclined portions smaller, it is possible to make larger the area of the surface of the circuit board on which the conductive patterns can be formed.

In the method of manufacturing the hybrid integrated circuit device according to this aspect, first, the first and second grooves are formed, and the hybrid integrated circuits are integrated on the surfaces of the respective circuit boards. Thereafter, the individual circuit boards are separated from the others. In this way, the separation of the circuit boards can be easily performed. Moreover, since conductive dust produced upon this separation can be caused to occur as scarcely as possible, it is possible to suppress a short of an electric circuit due to the dust.

DETAILED DESCRIPTION OF THE PREFERRED EMBODIMENTS (First Embodiment for Describing Hybrid Integrated Circuit Device 1)

Figure 1A:
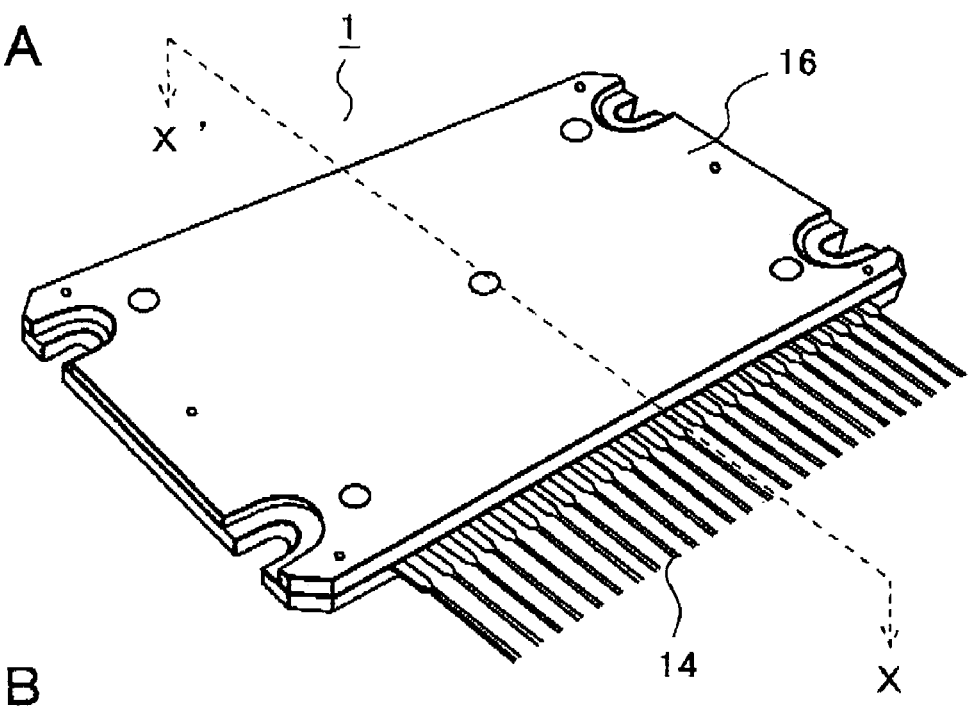
FIGS. 1A to 1C are a perspective view, a sectional view and a perspective view, respectively, of a hybrid integrated circuit device of a preferred embodiment.

A description will be given of a constitution of a hybrid integrated circuit device sealed with insulation resin, with reference to FIGS. 1A to 1C. FIG. 1A is a perspective view of a hybrid integrated circuit device 1, FIG. 1B is a sectional view taken along the line X–X' in FIG. 1A, and FIG. 1C is a perspective view of a circuit board 10.

Figure 1B:
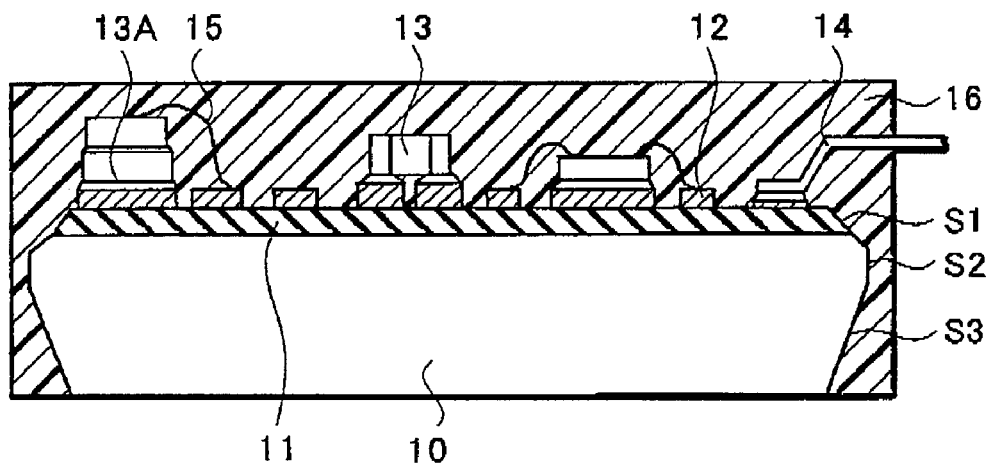
Figure 1C:
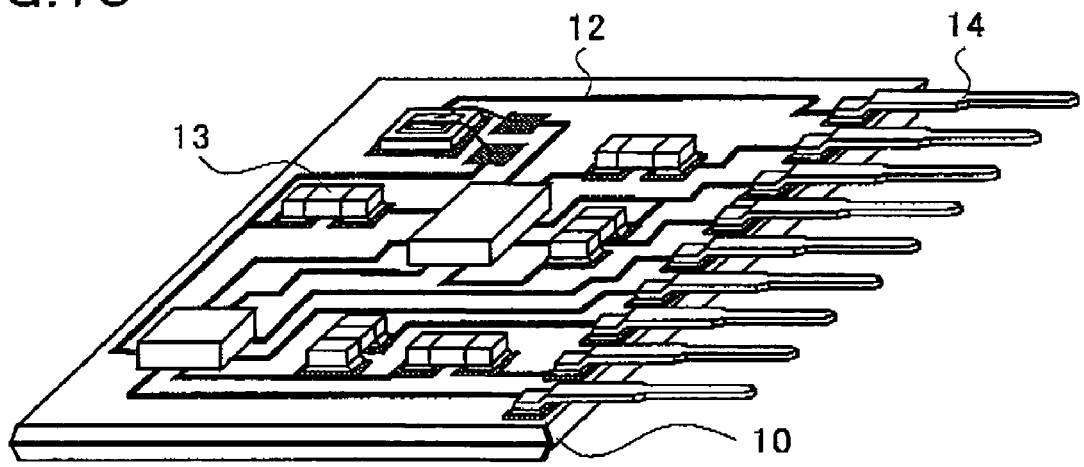

Referring to FIGS. 1A and 1B, the constitution of the hybrid integrated circuit device 1 will be described.

The hybrid integrated circuit device 1 of the preferred embodiments includes the circuit board 10 having a surface on which an insulating layer 11 is provided, conductive patterns 12 provided on the insulating layer 11, and circuit elements 13 mounted on the conductive patterns 12. Further, each side surface of the circuit board 10 includes a first inclined portion S1 which extends obliquely downward from a peripheral portion of the front surface of the circuit board 10, and a second inclined portion S3 which extends obliquely upward from the back surface of the circuit board 10 and is formed to be larger than the first inclined portion S1.

Insulation resin 16, as sealing resin, has a function to seal a hybrid integrated circuit composed of the circuit elements 13 and the like provided on the surface of the circuit board 10. As for the types of the insulation resin 16, a thermoplastic resin which seals the circuit by injection-molding, a thermosetting resin which seals the circuit by transfer-molding, or the like can be employed. Here, the insulation resin 16 covers an electric circuit formed on the surface of the circuit board 10 and further covers the side surface portions of the circuit board 10. Since the back surface of the circuit board 10 is exposed from the insulation resin here, the heat generated from the built-in circuit elements 13 can be actively dissipated to the outside. Alternatively, it is also possible to seal the circuit board 10, including the back surface as well, with the insulation resin 16. In this case, it is possible to improve the moisture resistance of the entire device. Moreover, although the circuit board 10 is sealed with resin here, other sealing configuration using a case material and the like can also be applied.

Referring to FIG. 1B, a side surface of the circuit board 10 has the first inclined portion S1 extending obliquely downward so as to expand outward from a peripheral portion of the surface of the circuit board 10. Further, the second inclined portion S3 extends obliquely upward so as to expand outward from a peripheral portion of the back surface of the circuit board 10. In addition, the first and second inclined portions S1 and S3 may be continuous through a perpendicular portion S2 which extends perpendicularly with respect to a face direction of the circuit board 10.

A point of the preferred embodiment is that the first inclined portion S1 is formed to be smaller than the second inclined portion S3. Specifically, the first and second inclined portions S1 and S3 extend in respective oblique directions relative to a horizontal direction. Accordingly, the smaller these inclined portions are, the longer their extending distances in a lateral direction are. Therefore, the first inclined portion S1 is made as small as possible by forming the second inclined portion S3 to be larger than the first inclined portion S1, whereby the extending distance of the first inclined portion S1 in the lateral direction can be made short. Thus, it will be possible to make the effective area of the surface of the circuit board 10 as large as possible, and thus it will be possible to make an area on which the conductive patterns 12 can be formed larger.

Referring to FIG. 1C, the hybrid integrated circuit device 1 has the following constitution. Specifically, the hybrid integrated circuit device 1 includes the circuit board 10 made of metal, the insulating layer 11 formed on the surface of the circuit board 10, the conductive patterns 12 formed on the insulating layer 11, the circuit elements 13 mounted on the conductive patterns 12 at predetermined positions, and the like. Each of such components will be described in detail below.

For the material of the circuit board 10, a metal is employed such as aluminum, copper or iron. An alloy of any of these metals may also be employed as the material of the circuit board 10. Here, the circuit board 10 made of aluminum is employed, and both faces thereof may be anodized. A specific manufacture method for forming the circuit board 10 will be described later in an embodiment for describing a method of manufacturing the hybrid integrated circuit device.

The insulating layer 11 is formed on the surface of the circuit board 10 and has a function to insulate the circuit board 10 from the conductive patterns 12. Moreover, the insulating layer 11 is highly filled with alumina in order to actively transmit the heat generated by the circuit elements 13 to the circuit board 10.

The conductive patterns 12 are provided on the surface of the insulating layer 11 and are formed of metal such as copper. Here, the conductive patterns 12 are formed on the overall surface of the circuit board 10. Specifically, the conductive patterns 12 are formed even in the vicinity of the peripheral end portions within 2 mm from the peripheral ends of the circuit board 10. The reason why the conductive patterns 12 can be formed even on the surface near the peripheral end portions of the circuit board 10 as described above is a method of splitting the circuit board 10. Although details about the method of splitting the circuit board 10 will be described later, the individual circuit boards 10 are split off from a large metal board by cutting the metal board in the preferred embodiment. In a conventional example, since a circuit board was split off by using a press, margins were needed in the vicinity of the peripheral end portions of the circuit board 10. However, in the preferred embodiment of the present invention, it is possible to eliminate these margins. Accordingly, it is possible to form the conductive patterns 12 on the entire surface of the circuit board 10. More specifically, the distance from a peripheral end portion of the circuit board 10 to an outermost conductive pattern can be reduced to around 0.5 mm.

The circuit elements 13 are mounted on the conductive patterns 12 at the predetermined positions through a brazing material such as soft solder. For the circuit elements 13, passive elements, active elements, circuit devices, and the like can be employed in general. When a power element is mounted, the element is mounted on a heat sink bonded onto the conductive patterns. In the preferred embodiment of the present invention, the circuit elements 13 can be placed at arbitrary positions on the circuit board 10. That is, the circuit elements 13 can be placed in the vicinity of the peripheral end portions of the circuit board 10. Here, for the active elements, a transistor, a LSI chip, a diode, and the like are employed. For the passive elements, a chip resistor, a chip capacitor and the like are employed. In addition to these, for the passive elements, elements which have electrode portions on both ends, such as an inductance, a thermistor, an antenna, and an oscillator, are employed. Furthermore, a resin-sealed package and the like can also be bonded to the conductive patterns 12 as the circuit elements.

A heat sink 13A is mounted on the conductive patterns 12 at a predetermined position. A power semiconductor element is mounted on the upper face of the heat sink 13A and is electrically connected to the conductive patterns 12 by fine metal wires 15. Here, the heat sink 13A can be placed at an arbitrary position on the circuit board 10. Specifically, the heat sink 13A can be placed even in the vicinity of the peripheral end portions within 2 mm from the peripheral ends of the circuit board 10. The reason why the heat sink 13A can be placed even on the surface near the peripheral end portions of the circuit board 10 as described above is the method of splitting the circuit board 10.

Although details about the method of splitting the circuit board 10 will be described later, the individual circuit boards 10 are split off from a large metal board by cutting the metal board in the preferred embodiment. In a conventional example, since a circuit board was split off by using a press, margins were needed in the vicinity of the peripheral end portions of the circuit board 10. Moreover, the heat sink 13A with a power element mounted thereon is an element having the largest height among the circuit elements 13. Therefore, the heat sink 13A could not be placed in the peripheral portions of the circuit board 10. In the preferred embodiment of the present invention, it will be possible to eliminate the margins, and therefore it will be possible to place the heat sink 13A at any position on the surface of the circuit board 10. Similar facts can apply to the other circuit elements 13.

Leads 14 are bonded to pads made of the conductive patterns 12 and have a function to provide inputs from and outputs to the outside. In addition, an overcoating of resin or the like can be applied to the conductive patterns 12 which provide no electrical connection.

According to the constitution of the hybrid integrated circuit device 10 as described above, the following effects can be achieved.

The conductive patterns 12 can be formed even in the vicinity of the end portions of the circuit board 10. Accordingly, when the same circuit as a conventional one is formed, the size of the entire hybrid integrated circuit device can be reduced.

Since the circuit elements 13 can be placed even in the vicinity of the end portions of the circuit board 10, the degree of freedom in designing the electric circuit can be enhanced. Moreover, since the pattern density can be increased, the size of the entire hybrid integrated circuit device can be reduced when the same circuit as the conventional one is formed.

Since an anchor effect occurs between the inclined portions of the circuit board 10 and the insulation resin 16, it is possible to prevent the circuit board 10 from separating from the insulation resin 16.

The part where the back and side surfaces of the circuit board 10 are continuous is formed at an obtuse angle and therefore is not in a round shape. Accordingly, in a process of sealing the circuit board with the insulation resin 16 using a mold while exposing the back surface of the circuit board, it is possible to prevent the insulation resin 16 from entering the space between the mold die and the circuit board 10. Thus, it is possible to prevent the insulation resin 16 from attaching to the back surface of the circuit board 10.

Figure 2A:
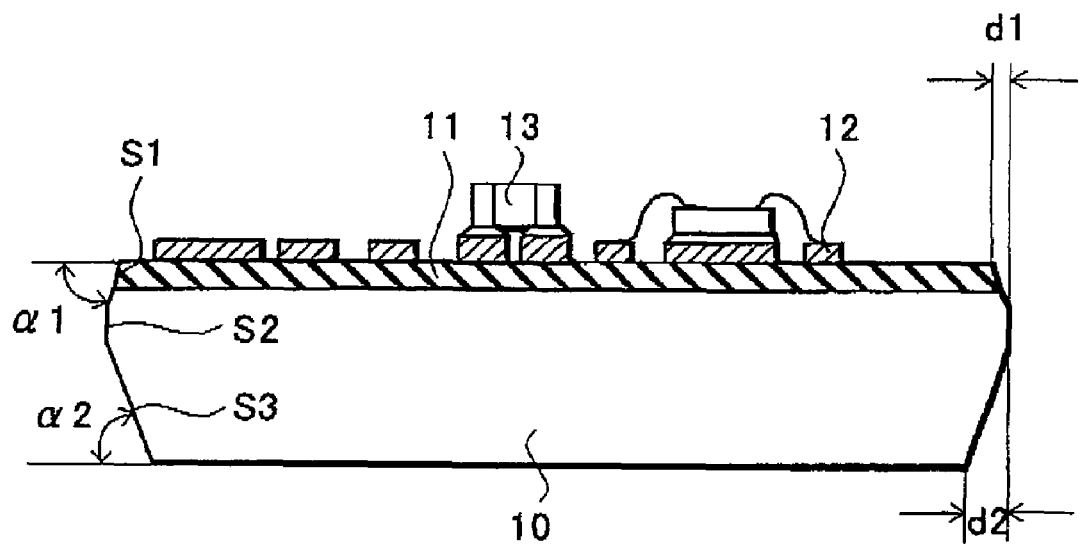
FIGS. 2A and 2B are sectional views of hybrid integrated circuit devices of the preferred embodiment.

Now a description will be given of the constitution of a side surface portion of the circuit board 10 with reference to a sectional view of FIG. 2A. First, the angle made by outside of the first inclined portion S1 and the surface of the circuit board 10 is assumed to be $\alpha 1$. Second, the angle made by outside of the second inclined portion S3 and the back surface of the circuit board 10 is assumed to be $\alpha 2$. In this case, it is preferred that the angle $\alpha 1$ be made small.

The bigger the angle $\alpha 1$ is made, the shorter a distance d1 between an end portion of the entire circuit board 10 and an end portion of the surface of the circuit board 10 can be made. Accordingly, it is possible to make the substantial area of the surface of the circuit board 10 large, and therefore it is possible to increase the effective area on which the conductive patterns 12 can be formed.

In addition, it is preferable that the angle $\alpha 2$ be as large as possible. Specifically, the angle $\alpha 2$ had better be made larger than the above-mentioned angle $\alpha 1$. This is because the adhesion strength between the circuit board 10 and the resin can be enhanced by the fact that the sealing resin is distributed under the face of the second inclined portion S3 in a later process of resin-sealing.

Further, assuming that the distance between the peripheral end portion of the entire circuit board 10 and the peripheral end portion of the back surface of the circuit board 10 is d2, the distance d2 is larger than the distance d1. Furthermore, by making the distance d2 longer, it is possible to enhance the adhesion between the sealing resin, which covers the surface and side surfaces of the circuit board 10, and the side surfaces of the circuit board 10.

Figure 2B:
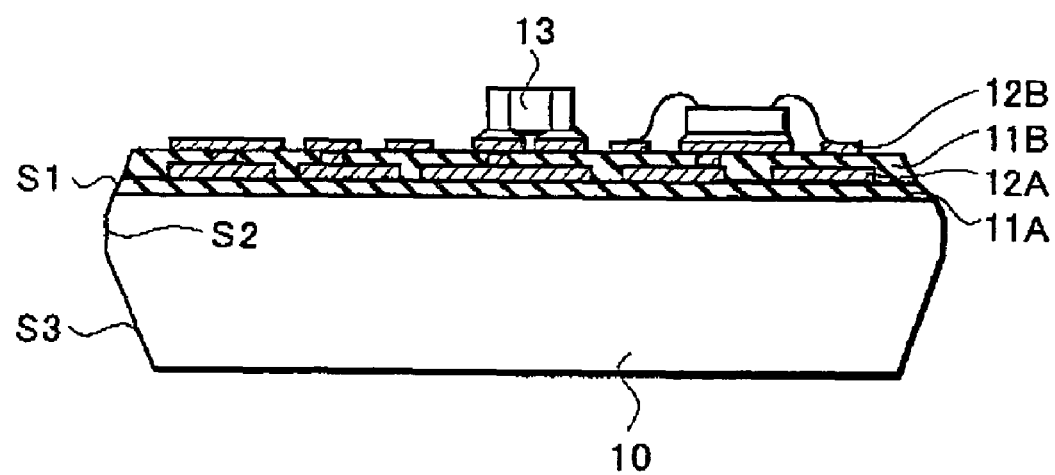

Referring to FIG. 2B, here, multiple-layer conductive patterns are formed on the surface of the circuit board 10. Specifically, a first insulating layer 11A is formed on the surface of the circuit board 10 made of metal. Next, first conductive patterns 12A are patterned on the surface of the first insulating layer 11A. Further, second conductive patterns 12B are formed above the first conductive patterns 12A with a second insulating layer 11B interposed therebetween. The first and second conductive patterns 12A and 12B are electrically connected to each other at predetermined positions by penetrating the second insulating layer 11B. In addition, the circuit elements 13 are bonded to the second conductive patterns 12B, which is an upper layer. Although a two-layer interconnection structure is shown here, an interconnection structure with three layers or more may be formed.

The formation of the multi-layer interconnections results in the insulating layers 11 also being formed in multi-layers. Accordingly, the total thickness of the insulating layers 11 becomes larger along with an increase in the number of layers of the conductive patterns 12. Specifically, when the one-layer conductive patterns 12 are formed, the thickness of the insulating layer 11 is approximately 60 µm. By comparison, when the first and second conductive patterns 12A and 12B are formed, the sum of the thicknesses of the first and second insulating layers 11A and 11B is approximately 120 µm. The circuit board with such thick insulating layers 11 formed on the surface thereof is difficult to split off by a conventional method using a press. This is because cracks are easily caused in the thick insulating layers 11 due to an impact of the press.

(Second Embodiment for Describing Method of Manufacturing Hybrid Integrated Circuit Device)

A description will be given of a method of manufacturing the hybrid integrated circuit device described in the first embodiment, with reference to FIGS. 3A to 10.

Figure 3A:
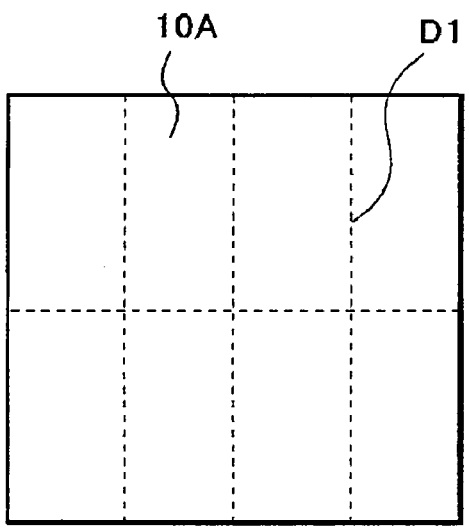
FIGS. 3A to 3C are a plan view, a perspective view and an enlarged view, respectively, showing a method of manufacturing a hybrid integrated circuit device of the preferred embodiment.
Figure 3B:
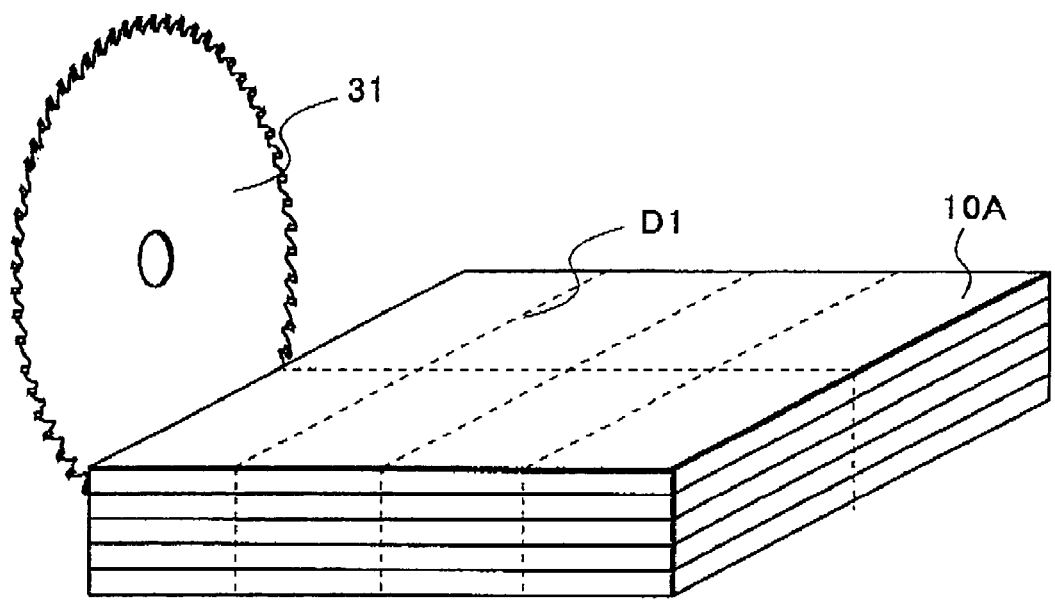
Figure 3C:
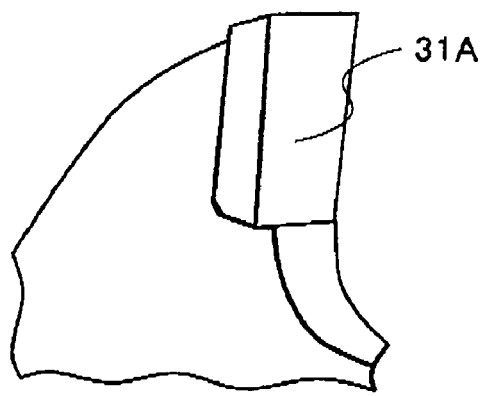

First Process (see FIGS. 3A to 3C)

This process is a process of forming an intermediate metal board 10B by splitting a large metal board 10A.

First, referring to FIG. 3A, the large metal board 10A is prepared. The size of the large metal board 10A is, for example, approximately one meter square. Here, the metal board 10A is an aluminum board with both faces anodized. An insulating layer is provided on the surface of the metal board 10A. Moreover, copper foil to become conductive patterns is formed on the surface of the insulating layer. In addition, in the case of forming multi-layer conductive patterns, multiple sheets of copper foil are attached with an insulating layer interposed between each of the sheets of copper foil.

Next, referring to FIG. 3B, the metal board 10A is split along dicing lines D1 by using a cut-off saw 31. Here, a plurality of the metal boards 10A are stacked and split at the same time. While rotating at high speed, the cut-off saw 31 cuts and splits the metal boards 10A along the dicing lines D1. As a method of dividing, here, the large metal board 10A having a square shape is divided into eight boards along the dicing lines D1, whereby the narrow intermediate metal boards 10B are made. As for the shape of the intermediate metal board 10B, the length of the long sides is twice the length of the short sides.

Referring to FIG. 3C, the shape of a cutting edge of the cut-off saw 31 and the like will be described. FIG. 3C is an enlarged view of the vicinity of a cutting edge 31A of the cut-off saw 31. An end portion of the cutting edge 31A is formed to be flat, and diamond is embedded therein. The metal board 10A can be cut and split along the dicing lines D1 by rotating the cut-off saw having such cutting edges at high speed.

The intermediate metal board 10B manufactured by this process is subjected to etching to partially remove the copper foil, whereby the conductive patterns are formed. As for the number of the conductive patterns to be formed, it is possible to form conductive patterns capable of forming several tens to several hundreds of hybrid integrated circuits on one metal board 10B, depending on the sizes of the metal board 10B and of hybrid integrated circuits.

Here, the metal board 10A may be split by punching. Specifically, the metal board 10B having a size equivalent to several (e.g., approximately two to eight) circuit boards may be formed by punching.

Second Process (see FIGS. 4A to 5B)

Figure 4A:
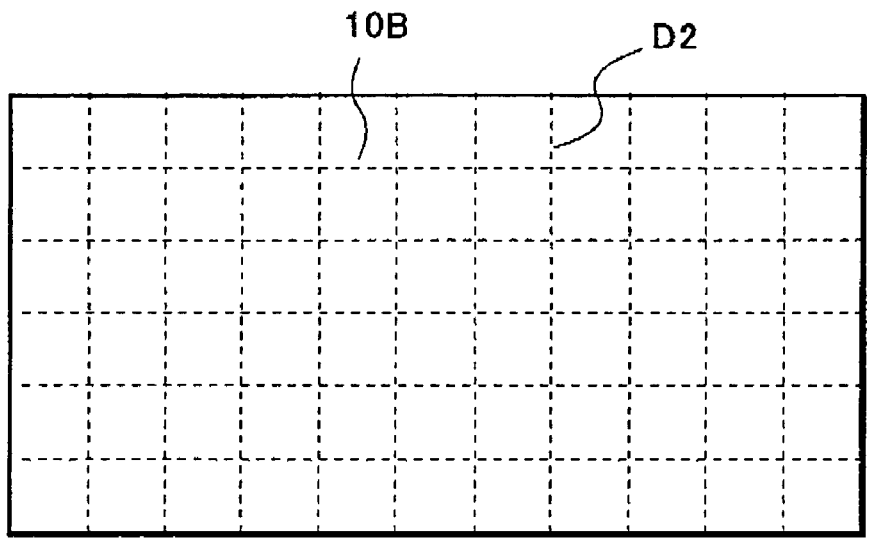
FIGS. 4A to 4C are a plan view, a perspective view and an enlarged view, respectively, showing the method of manufacturing the hybrid integrated circuit device of the preferred embodiment.
Figure 4B:
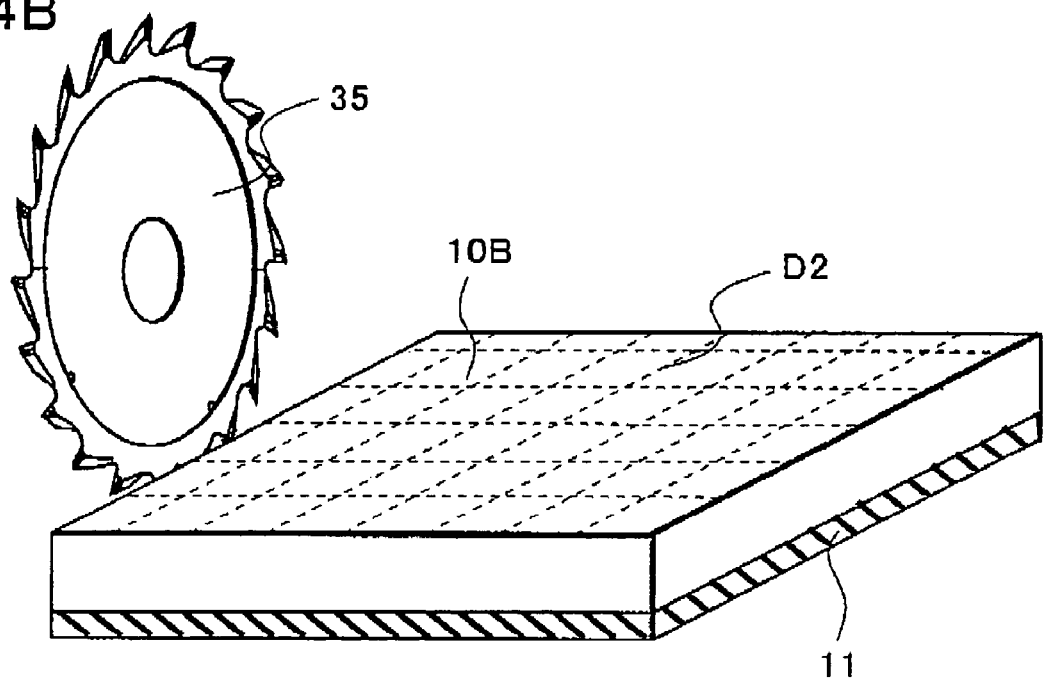
Figure 4C:
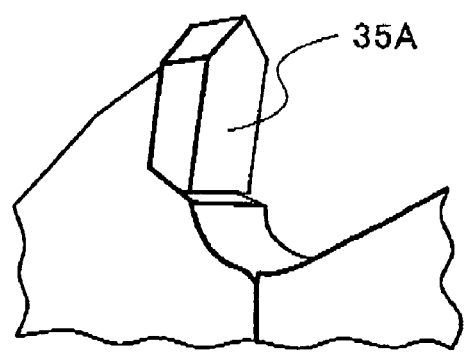

This process is a process of forming first and second grooves 20A and 20B, each in a grid pattern, on the surface and back surface of the intermediate metal board 10B, respectively. FIG. 4A is a plan view of the intermediate metal board 10B after split-off in the previous process. FIG. 4B is a perspective view showing a state where the grooves are formed on the metal board 10B by using a V-cut saw 35. FIG. 4C is an enlarged view of a cutting edge 35A.

Referring to FIGS. 4A and 4B, while rotating the V-cut saw 35 at high speed, the first grooves 20A are formed on the surface of the metal board 10B along dicing lines D2. Further, the second grooves 20B are formed on the back surface of the metal board 10B at positions corresponding to the first grooves 20A. The dicing lines D2 are provided in a grid pattern. Moreover, the dicing lines D2 correspond to the borders between units of conductive patterns, constituting respective individual circuits formed on the insulating layer 11.

Referring to FIG. 4C, the shape of the V-cut saw 35 will be described. A large number of the cutting edges 35A, each having a shape as shown in FIG. 4C, are arranged on the V-cut saw 35. Here, the shape of the cutting edges 35A corresponds to a shape of the grooves to be formed on the metal board 10B. Here, the grooves, each having a V-shaped section, are formed on both faces of the metal board. Accordingly, the shape of the cutting edges 35A is also a V-shape. Note that diamond is embedded in the cutting edges 35A.

Figure 5A:
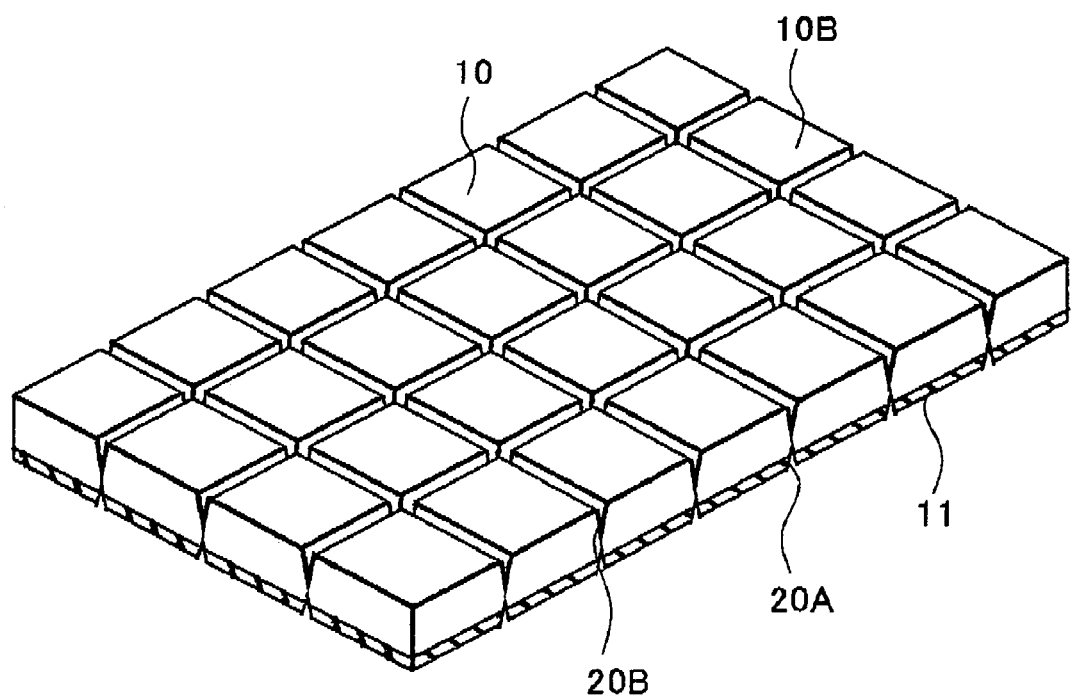
FIGS. 5A and 5B are a perspective view and a sectional view, respectively, showing the method of manufacturing the hybrid integrated circuit device of the preferred embodiment.

Next, a description will be given of the shape of the metal board 10B with the grooves 20 formed thereon, with reference to FIGS. 5A and 5B. FIG. 5A is a perspective view of the metal board 10B on which the grooves are formed by using the V-cut saw 35, and FIG. 5B is a sectional view of the metal board 10B.

Referring to FIG. 5A, the first and second grooves 20A and 20B are formed, each in a grid pattern, on the surface and back surface of the metal board 10B, respectively. Here, the planar positions of the first grooves 20A precisely correspond to those of the second grooves 20B. In this embodiment, since the grooves are formed by using the V-cut saw 35 having the V-shaped cutting edges 35A, the grooves 20 each have a V-shaped section. The center line of each groove 20 corresponds to each border between units of the conductive patterns 12, constituting the respective individual circuits formed on the insulating layer 11. Here, the first grooves 20A are formed on the face on which the resin layer 11 is formed, and the second grooves 20B are formed on the opposite face.

Figure 5B:
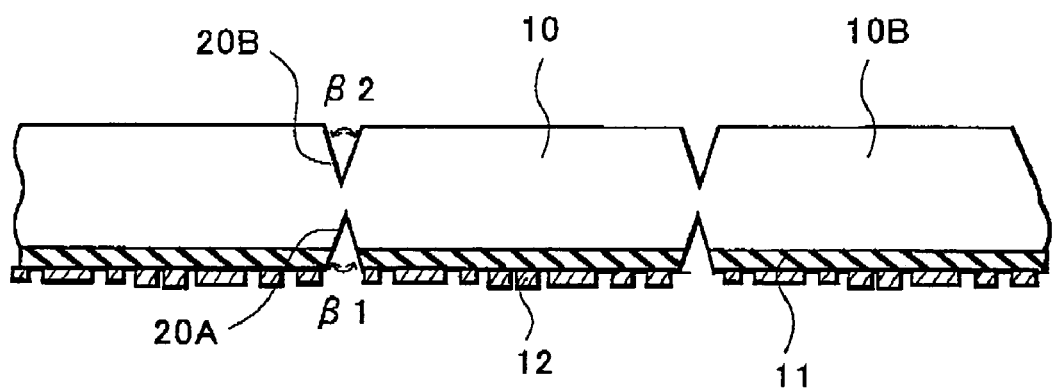

Referring to FIG. 5B, the shapes of the grooves 20 and the like will be described. Here, the grooves 20 are formed such that the sections thereof are in V shapes. Each of the depths of the first and second grooves 20A and 20B is less than half the thickness of the metal board 10B. Accordingly, the circuit board 10B is not split into the individual circuit boards 10 in this process. That is, each of the circuit boards 10 is connected to others through portions which correspond to the positions of the grooves 20 and have a thickness left behind in the metal board 10B. Accordingly, the metal board 10B can be handled as one sheet until the metal board 10B is split into the individual circuit boards 10. In addition, when "burrs" occur in this process, the "burrs" are removed by high-pressure cleaning. Moreover, here, the second grooves 20B are formed to be larger than the first grooves 20A.

Here, the widths and depths of the first and second grooves 20A and 20B can be adjusted flexibly. Specifically, it is possible to increase the effective area, where the conductive patterns 12 can be formed, by reducing an angle $\beta1$ at which the first groove 20A is opened. Moreover, a similar effect can be achieved by reducing the depth of the first grooves 20A. Furthermore, it is possible to accelerate the distribution of resin to the vicinity of the second grooves 20B in a later process, by increasing an angle $\beta2$ at which the second groove 20B is opened. Here, the second grooves 20B are formed to be larger than the first grooves 20A.

Figure 6:
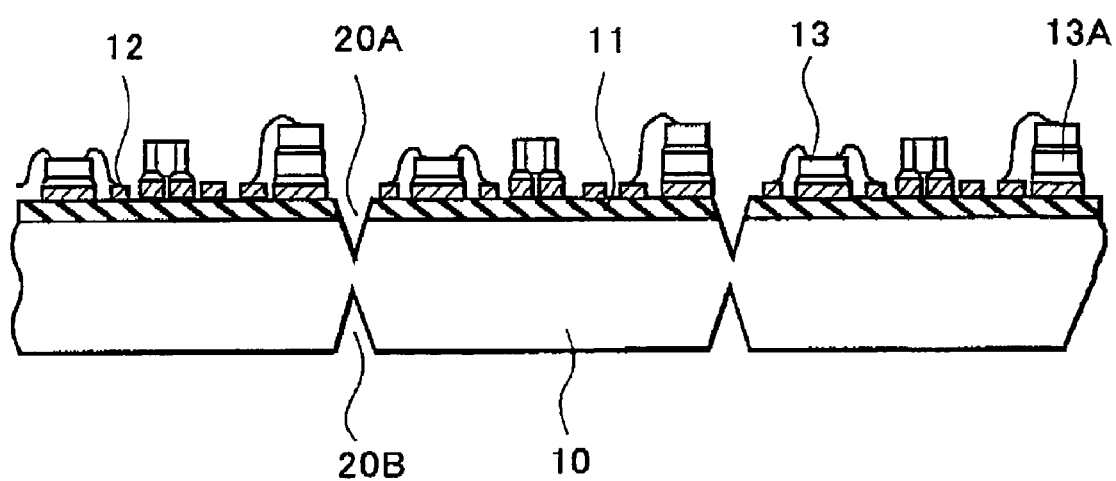
FIG. 6 is a sectional view showing the method of manufacturing the hybrid integrated circuit device of the preferred embodiment.
Figure 7:
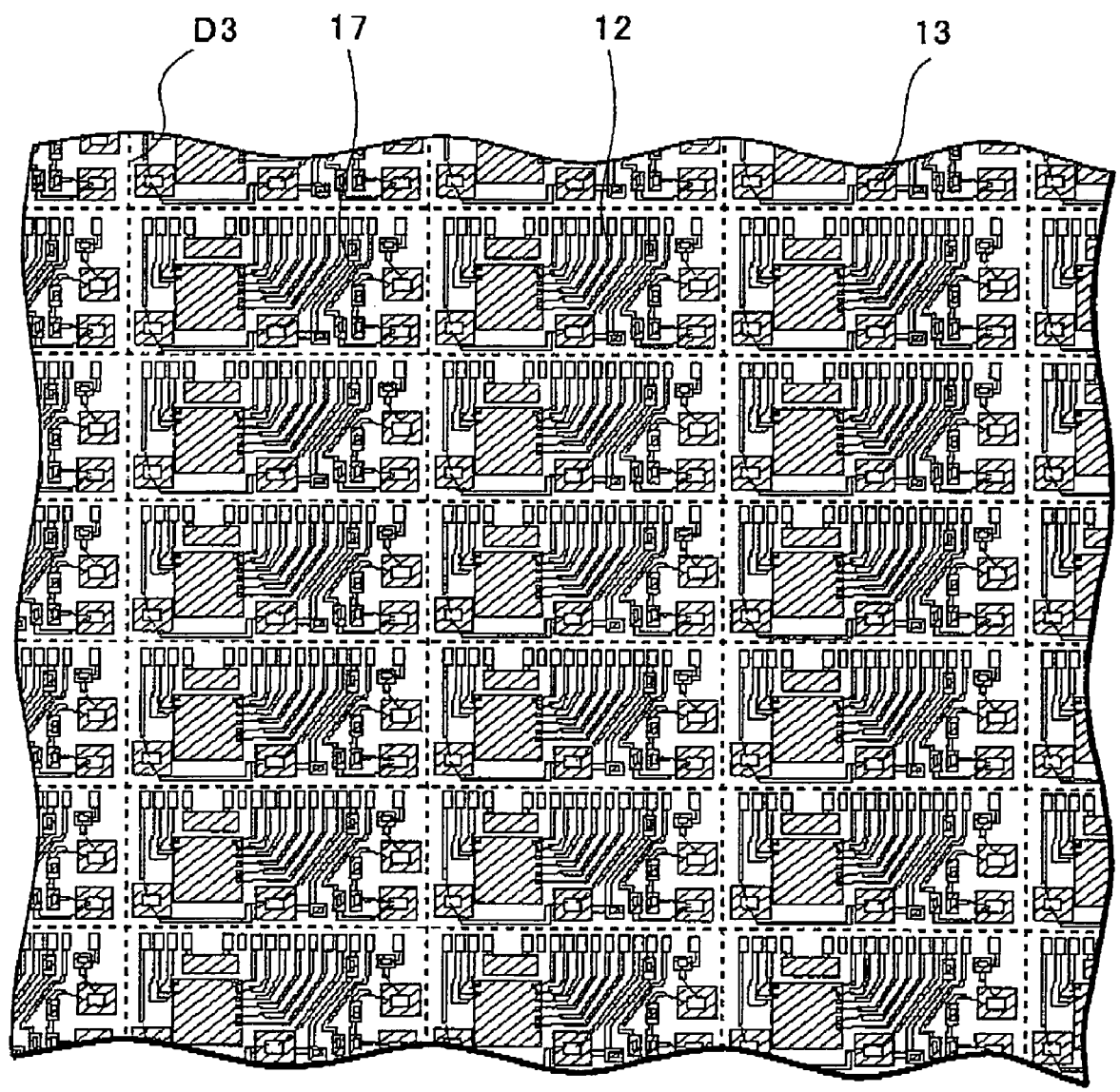
FIG. 7 is a plan view showing the method of manufacturing the hybrid integrated circuit device of the preferred embodiment.

Third Process (see FIGS. 6 and 7)

This process is a process of mounting the circuit elements 13 on the conductive patterns 12, and electrically connecting the circuit elements 13 to the conductive patterns 12.

A description will be given of a die-bonding process for mounting the circuit elements 13 on the conductive patterns 12, with reference to FIG. 6. The circuit elements 13 are mounted on the conductive patterns 12 at predetermined positions through a brazing material such as soft solder. As described earlier, the conductive patterns 12 are formed even in the vicinity of the peripheral end portions of the circuit boards 10. Accordingly, the circuit elements 13 also can be mounted in the vicinity of the peripheral end portions of the circuit boards 10. In addition, the heat sink 13A with a power element mounted on the upper face thereof is a circuit element having a certain height, compared with the other circuit elements. For this reason, the heat sinks 13A could not be placed in the vicinity of the peripheral end portions of the circuit boards 10 by a conventional method of manufacturing a hybrid integrated circuit device using a press. As will be described later, in the preferred embodiment of the present invention, the individual circuit boards 10 are split off by using a round cutter. Accordingly, it is possible to place circuit elements 13 having a certain height such as the heat sinks 13A in the vicinity of the peripheral end portions of the circuit boards 10.

Next, a description will be given of a wire-bonding process for electrically connecting the circuit elements 13 to the conductive patterns 12. Here, wire-bonding is performed at once on several tens to several hundreds of hybrid integrated circuits formed on one metal board 10B.

A specific description will be given of the hybrid integrated circuits formed on the metal board 10B, with reference to FIG. 7. FIG. 7 is a plan view of one part of hybrid integrated circuits 17 formed on the metal board 10B. A larger number of the hybrid integrated circuits 17 are formed actually. In this drawing, dicing lines D3 for dividing the metal board 10B into the individual circuit boards 10 are indicated by the dotted lines. As is obvious in this drawing, the conductive patterns 12 forming each hybrid integrated circuit, and the dicing lines D3 are extremely close to each other. For this reason, it is found that the conductive patterns 12 are formed on the overall surface of the metal board 10B. Moreover, it is found that the circuit elements 13 such as the heat sink 13A are placed in the peripheral portions of each hybrid integrated circuit.

In the above description, the hybrid integrated circuits are formed at once on the surface of the board 10B having a narrow shape. Here, if there are constraints in manufacturing devices for performing die-bonding and wire-bonding, it is also possible to split the metal board 10B into boards with a desired size in the process preceding this process. For example, when the metal board 10B is split into two in the process preceding this process, the obtained metal boards each become in a square shape.

Figure 8:
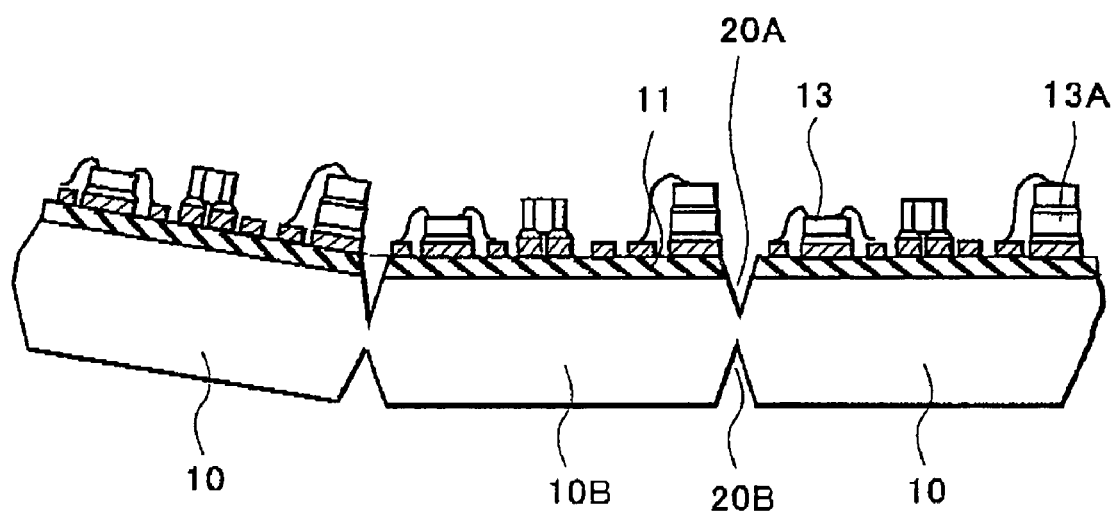
FIG. 8 is a sectional view showing the method of manufacturing the hybrid integrated circuit device of the preferred embodiment.
Figure 9A:
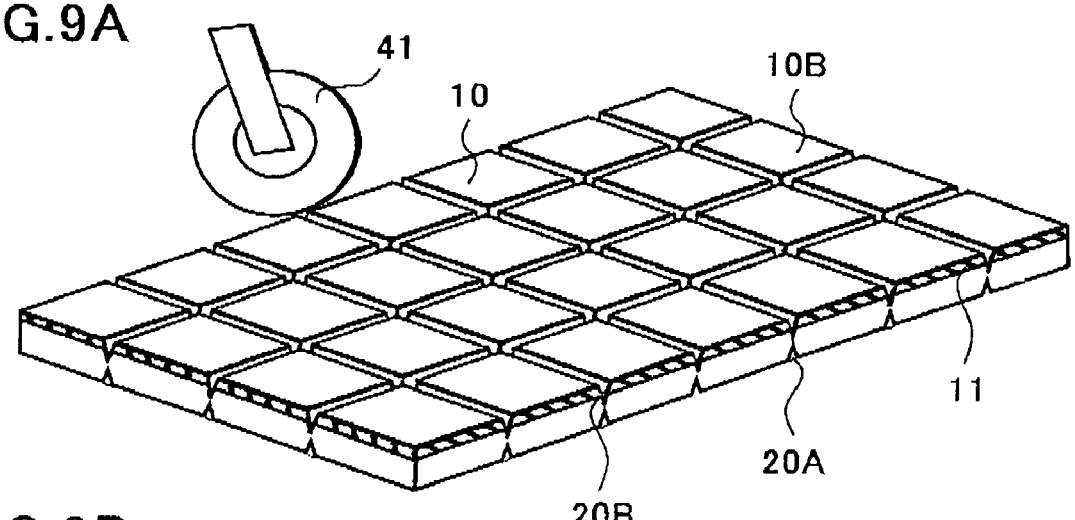
FIG. 9A is a perspective view and FIGS. 9B and 9C are sectional views, respectively, showing the method of manufacturing the hybrid integrated circuit device of the preferred embodiment.
Figure 9B:
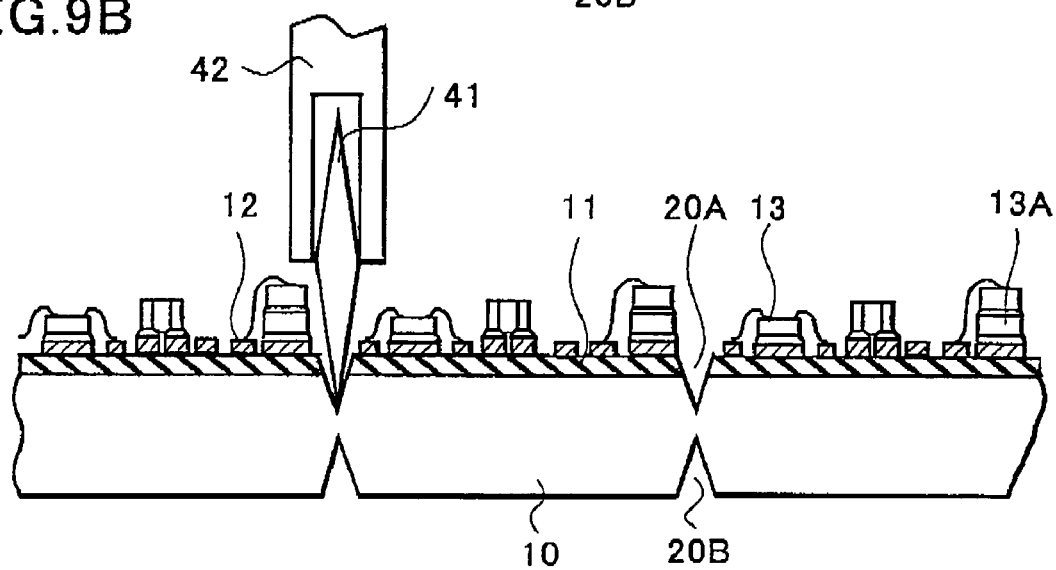
Figure 9C:
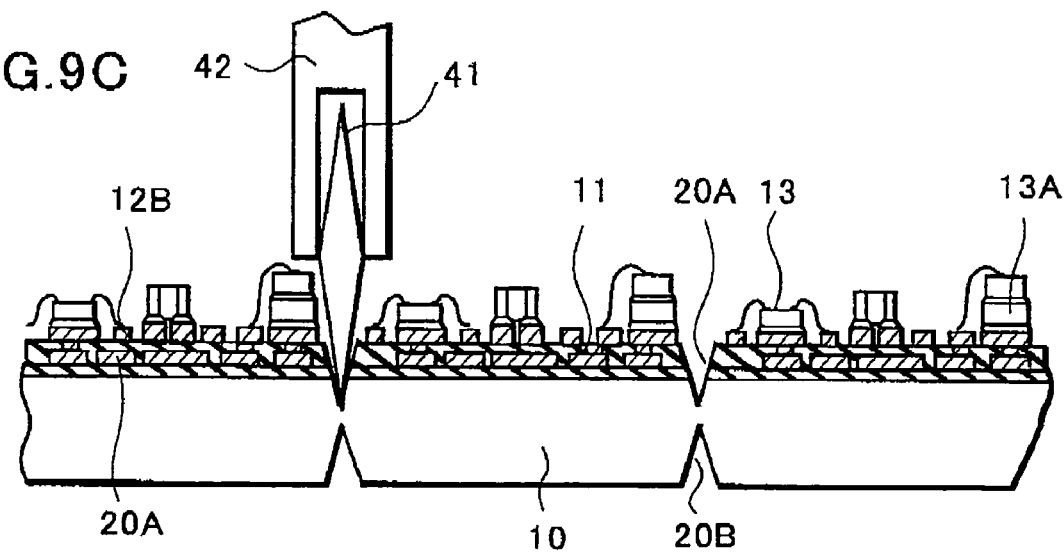

Fourth Process (see FIGS. 8 to 9C)

This process is a process of separating the individual circuit boards 10 from each other by splitting the metal board 10B along the portions where the grooves 20 are formed. FIG. 8 is a sectional view showing a method of splitting the metal board 10B into the circuit boards 10 by bending the metal board 10B. FIG. 9A is a perspective view showing a state of splitting the metal board 10B into the individual circuit boards 10 by using a round cutter 41. FIG. 9B is a sectional view of FIG. 9A. Here, in FIG. 9A, a large number of hybrid integrated circuits are formed on the insulating layer 11, which is not illustrated though.

A description will be given of the method of splitting the metal board 10B into the individual circuit boards 10 by bending the metal board 10B, with reference to FIG. 8. In this method, the metal board 10B is partially bent so that a portion where a first groove 20A and a second groove 20B are formed is bent. In each of the portions where the first and second grooves 20A and 20B are formed, the circuit boards 10 are connected only by a portion with a thickness left behind where the grooves 20 are not formed. Accordingly, each circuit board 10 can be easily separated from the others by bending the metal board 10B at these portions. In addition, the metal board 10B is partially bent from its back surface so that the electric circuits formed on the surfaces of the metal boards 10B will not be damaged.

Next, a description will be given of the method of splitting the metal board 10B by using the round cutter 41, with reference to FIGS. 9A to 9C. Referring to FIG. 9A, the metal board 10B is pressed and cut with the round cutter 41 along the dicing lines D3. Thus, the metal board 10B is split into the individual circuit boards 10. The round cutter 41 presses and cuts the portions corresponding to the center lines of the respective grooves 20, the portions with a thickness left behind where the grooves 20 are not formed in the metal board 10B.

Referring to FIG. 9B, details about the round cutter 41 will be described. The round cutter 41 has a discoid shape, and the circumference portion thereof is formed at an acute angle. The central portion of the round cutter 41 is fixed to a support portion 42 so that the round cutter 41 is freely rotatable. The aforementioned cut-off saw cuts the metal board 10A while rotating at high speed with driving force. Here, the round cutter 41 does not have driving force. That is, the round cutter 41 is rotated by moving the round cutter 41 along the dicing lines D3 while pressing part of the round cutter 41 to the metal board 10B.

Further, referring to FIG. 9B, in the preferred embodiment of the present invention, it is possible to place the circuit elements 13 having a certain height, such as the heat sinks 13A, in the peripheral portions of the circuit boards 10. Therefore, there are some cases where the positions of the heat sinks 13A are close to the peripheral portions of the circuit boards 10, as shown in the drawing. Even in this case, the support portion 42 does not come in contact with the heat sinks 13A. Accordingly, it is possible to place elements having a certain height such as the heat sinks 13A in the peripheral portions of the circuit boards 10.

In addition, apart from the above-described methods, it is possible to separate the individual circuit devices 10 from the others by using laser. In this case, a laser beam is irradiated to the portions where the first grooves 20A are formed.

Referring to FIG. 9C, here, multi-layer interconnections including the first and second conductive patterns 12A and 12B are formed on the surfaces of the circuit boards 10. Due to the fact that the conductive patterns are formed in multi-layers, the insulating layers 11 become thick. Consequently, it is difficult to separate the individual circuit boards 10 from the others by punching using a press. Therefore, in this embodiment, the separation of the boards is performed by using the round cutter 41 as described above. Thus, it is possible to separate the individual circuit boards 10 from the others without damaging the insulating layers 11.

Figure 10:
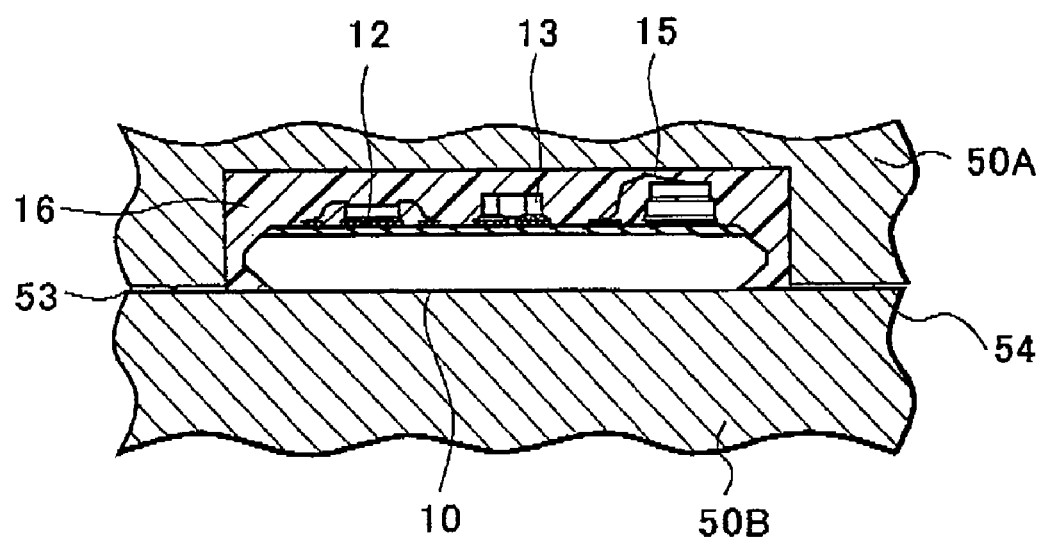
FIG. 10 is a sectional view showing the method of manufacturing the hybrid integrated circuit device of the preferred embodiment.
Figure 11A:
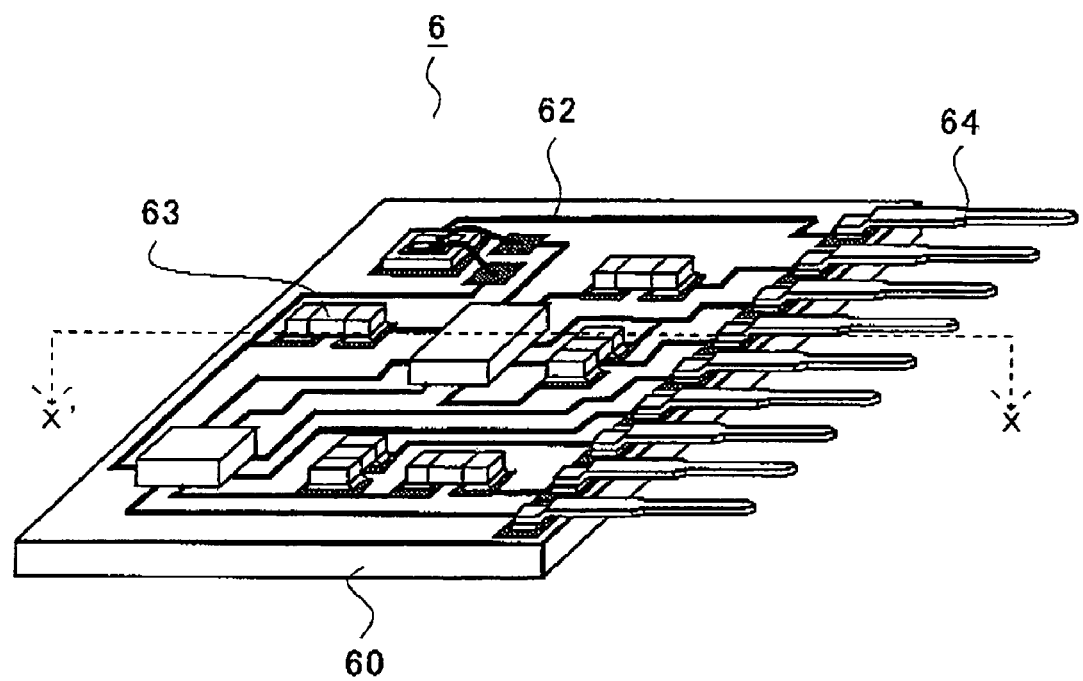
FIGS. 11A and 11B are a perspective view and a sectional view, respectively, of a conventional hybrid integrated circuit device.
Figure 11B:
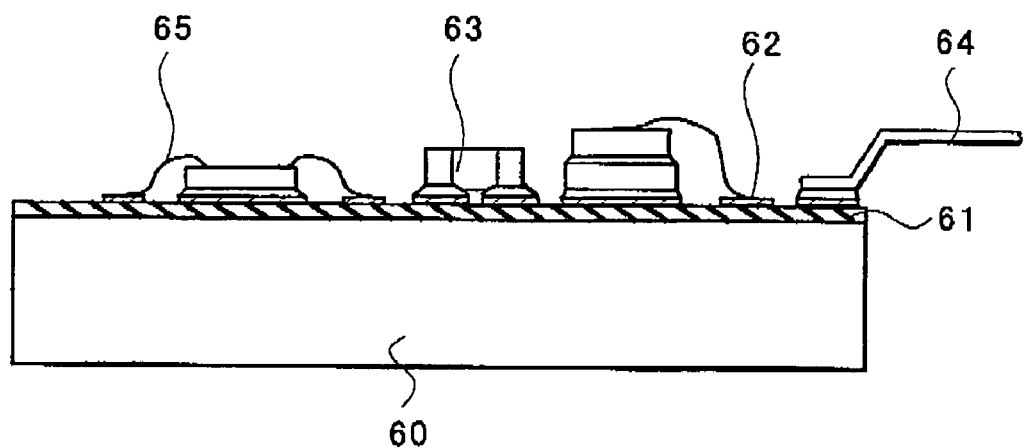
Figure 12A:
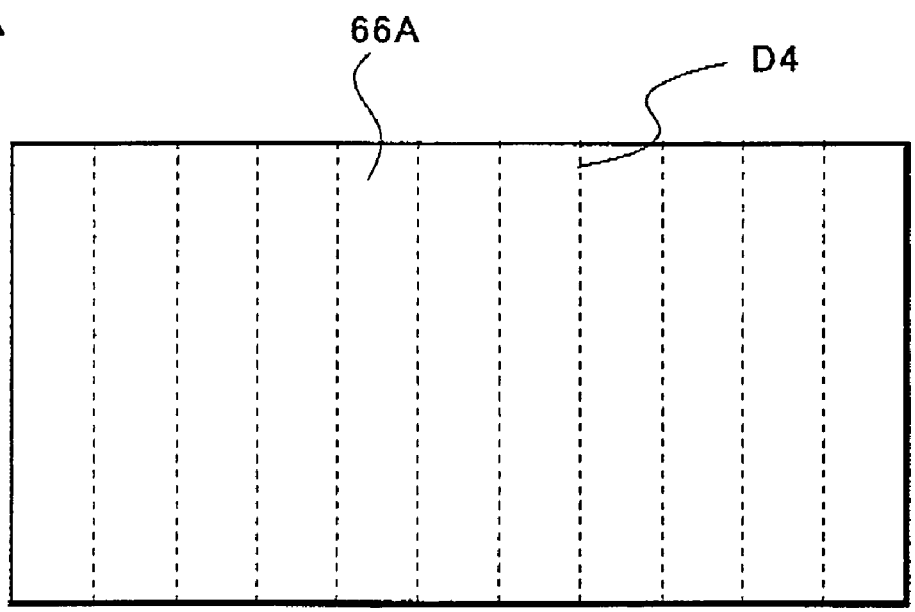
FIGS. 12A and 12B are a plan view and a sectional view, respectively, showing a method of manufacturing the conventional hybrid integrated circuit device.
Figure 12B:
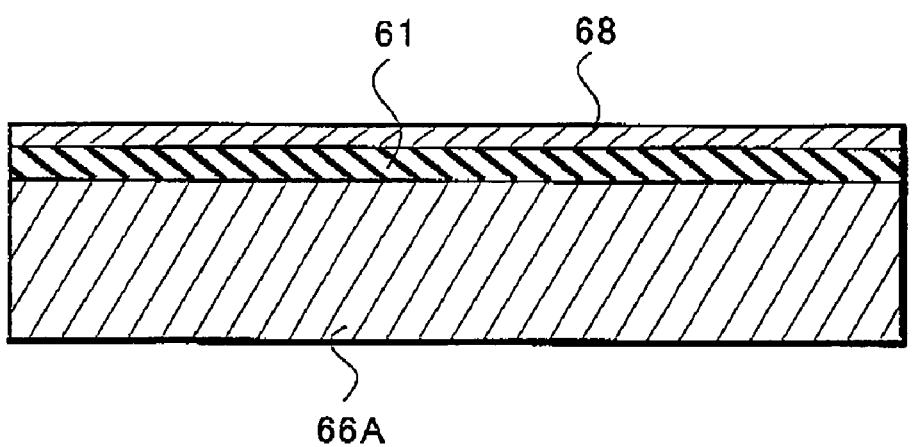
Figure 13A:
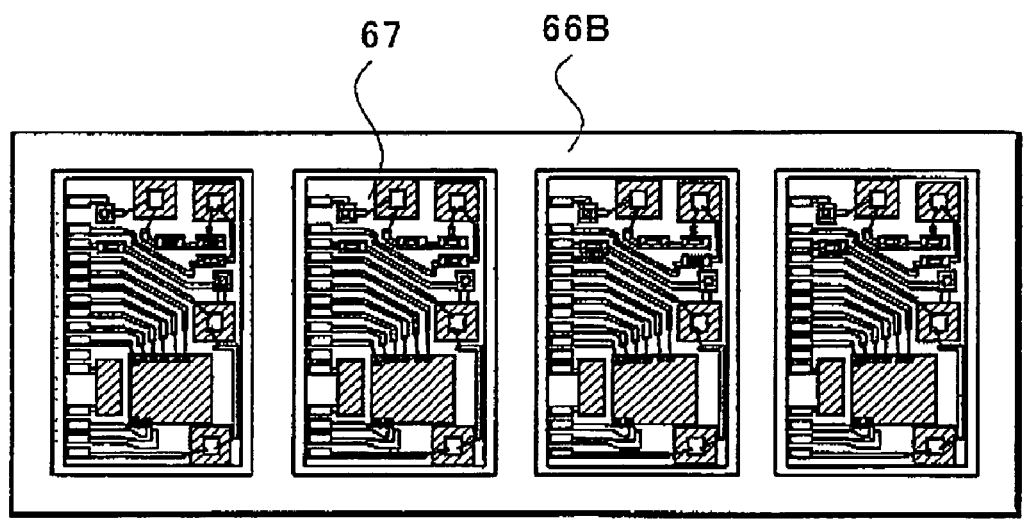
FIGS. 13A and 13B are a plan view and a sectional view, respectively, showing the method of manufacturing the conventional hybrid integrated circuit device.
Figure 13B:
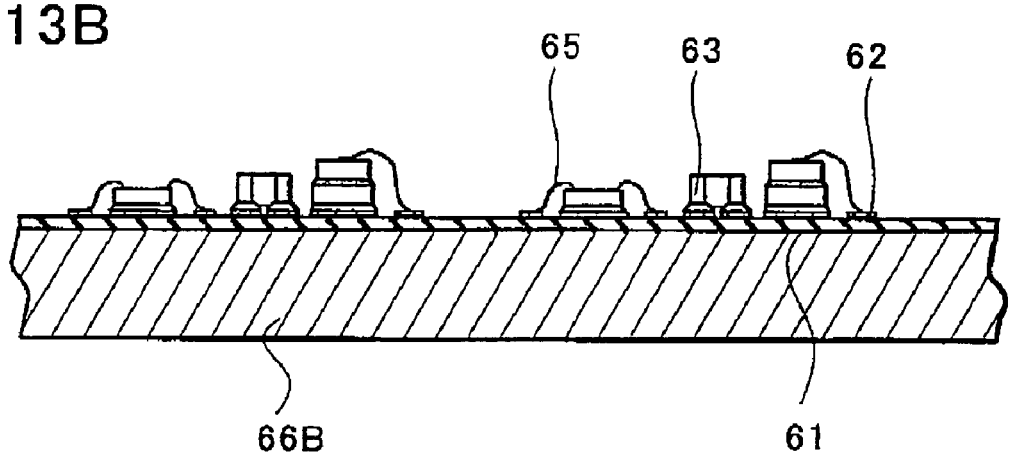
Figure 14:
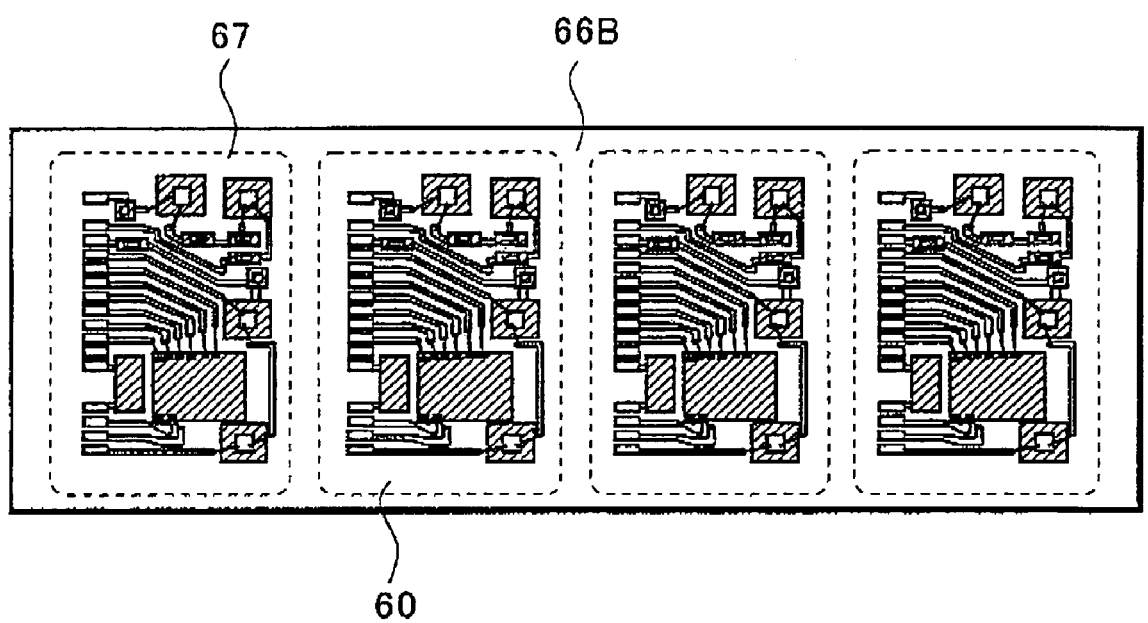
FIG. 14 is a plan view of the method of manufacturing the conventional hybrid integrated circuit device.

Fifth Process (see FIG. 10)

A description will be given of a process of sealing the circuit board 10 with the insulation resin 16, with reference to FIG. 10. FIG. 10 is a sectional view showing the process of sealing the circuit board 10 with the insulation resin 16 by using a mold 50.

First, the circuit board 10 is mounted on a lower mold 50B. Next, the insulation resin 16 is injected from a gate 53. For a sealing method, a transfer-molding method using thermosetting resin or an injection-molding method using thermoplastic resin can be employed. Thereafter, gas inside a cavity is discharged to the outside through an air vent 54, in accordance with the amount of the insulation resin 16 injected from the gate 53.

As described earlier, the inclined portions are provided to the side surface portions of the circuit board 10. Accordingly, the insulation resin 16 is distributed to the inclined portions by sealing the circuit board 10 with the insulation resin 16. Therefore, an anchor effect occurs between the insulation resin 16 and the inclined portions, and thus the adhesion between the insulation resin 16 and the circuit board 10 is enhanced. Further, the moisture resistance can be improved.

The circuit board 10 sealed with the resin by the above-described process is subjected to a lead-cutting process and the like, and then completed as a product.

According to this embodiment, the following effects can be achieved.

Since the first and second grooves 20A and 20B are formed in a grid pattern on the surface and back surface of the metal board 10B respectively, the circuit boards 10 can be easily split off along the portions where the grooves are formed. For the splitting-off of each circuit device 10, two methods are conceivable: splitting-off by bending, and splitting-off by using the round cutter 41. The splitting-off can be easily performed by any of these methods.

Since the large metal board is split by using the cut-off saw 31 capable of rotating at high speed, the incidence of "burrs" is very low compared with a case of using a conventional method of splitting a board by shearing.

Accordingly, in a middle step of the manufacturing processes or the like, it is possible to prevent a defective from being produced as a result of a short of a hybrid integrated circuit due to a "burr."

Moreover, even when the cut-off saw 31 has worn out, the replacement of the cut-off saw 31 is relatively simple work and therefore can be done quickly. Accordingly, compared with a conventional case of replacing a shearing blade, the working efficiency can be improved.

Further, it is possible to integrate several tens to several hundreds of hybrid integrated circuits on one metal board 10B. Accordingly, it is possible to perform each of the die-bonding and wire-bonding processes at once. Thus, the productivity can be increased.

Further, in the process of splitting the metal board 10B into the individual circuit boards 10, the metal board 10B is split while rotating the round cutter 41 having no driving force by pressing the round cutter 41 to the metal board 10B. Accordingly, since the round cutter 41 cuts the portions with the thickness left behind and the insulating layer 11, grinding wastes are not produced. Therefore, in the manufacturing processes, it is possible to prevent the hybrid integrated circuits from short-circuiting.

Further, the metal board 10B is split by pressing the round cutter 41 to the portions corresponding to the grooves 20. Accordingly, it is possible to prevent the pressure resistance of the circuit boards from decreasing due to the occurrence of cracks in the resin layer 11. In addition, the flatness of the board 10B can be ensured.

Further, even when the round cutter 41 has worn out, the replacement of the round cutter 41 is relatively simple work and therefore can be done in a short time. Thus, the productivity can be increased.

Further, in the preferred embodiment of the present invention, the individual circuit boards are separated from the others by "cutting" the metal board by using the cut-off saw 31 and the round cutter 41. When the circuit boards are separated by using a press as in a conventional example, it is necessary to prepare different blades depending on the sizes of the circuit boards to be manufactured. In the preferred embodiment of the present invention, even when hybrid integrated circuit devices having circuit boards of different sizes are manufactured, it is possible to deal with this fact only by changing the dicing lines.

Further, in the preferred embodiment of the present invention, a large number of hybrid integrated circuits are integrated in matrix on one metal board 10B. Since the hybrid integrated circuits are extremely close to each other, almost the entire metal board 10B becomes the circuit boards 10. Accordingly, it is possible to reduce the loss from disposal of the materials.

What is claimed is:

1. A hybrid integrated circuit device comprising:
a circuit board made of metal;
a conductive pattern provided on a front surface of the circuit board; and
a circuit element electrically connected to the conductive pattern,
wherein a side surface of the circuit board includes a first inclined portion which extends obliquely downward from a peripheral portion of the front surface of the circuit board, and a second inclined portion which extends obliquely upward from a back surface of the circuit board and is formed to be larger than the first inclined portion;
wherein the second inclined portion is formed to be larger than the first inclined portion in a thickness direction of the circuit board;
wherein a width of the first inclined portion is formed to be smaller than a width of the second inclined portion;
wherein the front surface and side surfaces of the circuit board is sealed with sealing resin;
wherein the first inclined portion and the second inclined portions are sealed with the sealing resin;
wherein the conductive pattern is formed within 2 mm from the end part of the circuit board on the surface of the circuit board; and
wherein the first inclined portion and the second inclined portion are located on the peripheral portion of the circuit board.

2. The hybrid integrated circuit device according to claim 1, wherein an angle which an outer side of the first inclined portion makes with said front surface of the circuit board is smaller than an angle which an outer side of the second inclined portion makes with said back surface of the circuit board.

3. The hybrid integrated circuit device according to claim 1, wherein the conductive patterns are formed in multi-layers.

4. The hybrid integrated circuit device according to claim 1, wherein the circuit board is a board made of metal, and wherein an insulating layer is formed on the surface of the circuit board.

5. The hybrid integrated circuit device according to claim 1, wherein the circuit board is made of metal which is one layer.

6. The hybrid integrated circuit device according to claim 1, wherein a plurality of the circuit element is disposed on the front-surface of the circuit board.

7. The hybrid integrated circuit device according to claim 1, wherein said first inclined portion and said second inclined portion are diced surfaces.

8. The hybrid integrated circuit device according to claim 7, wherein said first inclined portion and said second inclined portion are saw-diced surfaces.

9. A hybrid integrated circuit device according to claim 1 made by a method including: manufacturing surfaces of the first inclined portion and the second inclined portion by dicing.

10. The hybrid integrated circuit device of claim 9, wherein said method further includes dicing with a rotary cutter.

* * * * *